United States Patent [19]

Hallman et al.

[11] Patent Number: 5,820,932
[45] Date of Patent: Oct. 13, 1998

[54] PROCESS FOR THE PRODUCTION OF LITHOGRAPHIC PRINTING PLATES

[75] Inventors: Robert W. Hallman, Palisades Park, N.J.; Ken-ichi Shimazu, Briarcliff Manor; Hui Zhu, Yonkers, both of N.Y.

[73] Assignee: Sun Chemical Corporation, Fort Lee, N.J.

[21] Appl. No.: 565,288

[22] Filed: Nov. 30, 1995

[51] Int. Cl.[6] .................................................. B05D 1/36
[52] U.S. Cl. .................... 427/261; 427/504; 427/256; 427/258; 427/385.5; 427/388.5; 427/393.5; 101/463.1; 101/465; 101/466; 430/302
[58] Field of Search .................. 101/463.1, 465, 101/466; 427/504, 256, 258, 261, 385.5, 388.5, 393.5

[56] References Cited

U.S. PATENT DOCUMENTS

| | | | |
|---|---|---|---|
| 4,003,312 | 1/1977 | Gunther | 101/466 |
| 4,833,486 | 5/1989 | Zerillo | 346/1.1 |
| 5,466,653 | 11/1995 | Ma et al. | 503/200 |

FOREIGN PATENT DOCUMENTS 0503621  9/1992  European Pat. Off. .......... G03F 1/00
4-197777  7/1992  Japan .

OTHER PUBLICATIONS

Yamaguchi, CA 117:223164, Chemical Abstracts of ACS of JP 04–197777, issued Jul. 17, 1992, 10 pp.

Yamaguchi (JPOABS 04–197777), Patents Abstracts of Japan, Published Oct. 1992 of JP 04–197777.

Yamaguchi (Derwent 92–288725) English Abstract of Japananese Patent Document JP 04197777 A issued Jul. 17, 1992, from Derwent Information Ltd., 1997.

*Primary Examiner*—Cynthia Hamilton
*Attorney, Agent, or Firm*—Sidney Persley

[57] ABSTRACT

The invention utilizes ink jet liquid droplets from one or more printer heads to form an image upon the surface of a printing plate corresponding to digital information depicting the image as provided by a digital computer system which is in digital communication with the printer heads. The droplets from the printer head comprise resin forming reactants which polymerize on the plate surface, alone or in combination with reactants precoated on the plate, to form a printable hard resin image. The resin image so formed provides a lithographic printing plate useful for extended print runs.

3 Claims, 3 Drawing Sheets ns for the fabrication of a lithographic printing plate using ink jet printing heads and techniques. The novel process involves the direct formation of a resinous image pattern on a lithographic plate employing digital image information and digitally driven printer heads. The invention is especially useful for the fabrication of large, commercial grade, high production run lithographic printing plates for offset printing.

BACKGROUND OF THE INVENTION

Lithography and offset printing methods have long been combined in a compatible marriage of great convenience for the printing industry for economical, high speed, high quality image duplication in small runs and large. Known art available to the industry for image transfer to a lithographic plate is voluminous but dominated by the photographic process wherein a hydrophilic plate is treated with a photosensitive coating, exposed via a film image and developed to produce a printable, oleophilic image on the plate.

While preparing lithographic plates by photographic image transfer is relatively efficient and efficacious, it is a multi-step, indirect process of constrained flexibility. Typically, a photographically presensitized (PS) plate is prepared from a hydrophilically surface treated aluminum. A positive or negative film image of an original hard copy is prepared and the PS plate exposed to the film image, developed, washed and made ready for print operations. Any desired changes in the film image must be made by first changing the original hard copy and repeating the photographic process; hence, the constrained flexibility. As sophisticated and useful as it is to prepare plates by photographic image transfer, the need for a lithographic plate fabricating process that obviates the above problems associated with the photographic process has long been recognized. Clearly, it would be highly beneficial to the printing industry to directly produce a quality printable image on a plate without proceeding through a multi-step photographic process. It would also be highly efficacious if a process were developed whereby changes could be made in an original image in some predetermined manner without incurring the need to correct hard copy and repeat the photography, particularly if those changes could be made "on line".

Image forming by digital computer aided design of graphical material or text is well known. Electronically derived images of words or graphics presented on the CRT of a digital computer system can be edited and converted to final hard copy by direct printing with impact printers, laser printers or ink jet printers. This manner of printing or producing hard copy is extremely flexible and useful when print runs of no more than a few thousand are required but the print process is not feasible for large runs measured in the tens or hundreds of thousands of pieces. For large runs, printing by lithographic plate is still the preferred process with such plates prepared by the process of photographic image transfer.

It is known that digitized image information can be used in plate making wherein a film is made to express the image according to the image information digitization and an image is formed on the plate by exposure and development. While this method augments flexibility by permitting editing of a digitized image, the method does not overcome the problems associated with the photographic image transfer method of plate fabrication.

Recently, fabrication of lithographic plates by ink jet techniques has been proposed. One such technique is disclosed in Japanese patent application, Kokai 62-25081. This application describes the use of an ink jet system for applying an oleophilic liquid to form an image on the hydrophilic aluminum surface of a lithographic plate.

U.S. Pat. No. 4,833,486 discloses the use of an ink jet head to deposit a hot wax upon the surface of a lithographic plate. The hot wax solidifies upon contact with the plate, thus providing an instantaneous printing pattern. Plates prepared by this method are useful for very limited print runs of a few thousand pieces.

There are several advantages for fabricating printing plates by ink jet printers. One advantage is that such processes are environmentally friendly. The complex and potentially polluting chemical preparations and solvents ordinarily used in masking and stripping away photoresist areas of the plates are not always required with ink jet techniques.

The ink jet technology, however, is in its infancy with respect to commercial lithography. Present ink jet techniques cannot produce large or commercially acceptable offset plates. That is, the plates produced by present ink jet techniques have very low plate runs by commercial lithographic standards. Furthermore, there is no ink jet apparatus or process presently available for fabricating large offset plates having a plurality of pages disposed thereon. Indeed, U.S. Pat. No. 4,833,486 teaches that ink jet materials are inexpensive, and therefore, the printing plate may be used a minimum number of times and then discarded. Moreover, in one embodiment of the '486 patent, it is indicated that the system is designed for non-commercial plate production, inasmuch as an office processor system is proposed. Office processing systems ordinarily are not capable of providing the large amounts of digital information required to produce large, commercial lithographic plates.

A further drawback of the apparatus disclosed in the '486 patent is that it makes use of an ink jet medium which may be a wax. Wax is a soft material and will abrade with use under the conditions present for commercial offset printing. Even the so-called hard waxes will not provide the durability required for commercial printing runs of the order of 100,000 cycles. Moreover, waxes do not strongly bond to the printing plate surface, i.e., they prefer to remain on the surface, rather than to actively bond to the substrate.

European Patent Application EP 0 503 621 A1 discloses a direct lithographic plate making system using an ink jet system to form an ink image on the plate by exposure treatment of the plate.

Considering the foregoing problems associated with the production of lithographic printing plates and the limitations inherent in the prior art to overcome these problems, a series of objectives has been defined for the process of the instant invention.

A primary objective of the instant invention is to provide a process for the production of lithographic printing plates using ink jet printer heads and techniques to directly provide a printable image on the plate with good resolution and wearablity sufficient for large print runs.

Another objective of the invention is to integrate the methods of the primary objective with digital computer information systems for digital image formation and digital control of the ink jet printer heads.

A more specific objective of the invention is to create a printable resinous image on the lithographic plate using ink jet printing heads to describe the image on the plate surface with resin forming chemicals coupled with in situ polymerization of the chemicals.

Yet a further object is to describe the resinous image on the printing plate using digitized control of the ink jet printing heads.

SUMMARY OF THE INVENTION

The invention provides for a process for fabricating a printing plate, particularly a commercial lithographic or offset printing plate. The process utilizes ink jet liquid droplets from one or more printer heads to form an image upon the surface of the printing plate corresponding to digital information depicting the image as provided by a digital computer system which is in digital communication with the printer heads. Importantly, the droplets from the printer head polymerize on the plate surface to form a printable image comprising a resin. The physical characteristics of the resin so formed are such as to provide a lithographic printing plate useful for extended print runs.

The reactants which include monomers and initiators required to effect the polymerization may be precoated on the plate or deposited from one or more printing head in a manner designed to initiate polymerization upon deposition. Initiators may be chemical catalysts or electromagnetic radiation. Preferably, the polymerization is carried out using at least one multifunctional reactant that produces a crosslinked resin alone or in combination with other reactants. However, uncrossliked resins are also useful.

More particularly, the invention comprises a method for producing a lithographic printing plate containing a printable resinous image. The method comprises depositing a liquid comprising at least one reactant of a resin producing reaction mixture onto the plate employing at least one printer head in a predetermined image-reproducing manner. The liquid is deposited on the plate in contact with remaining reactant(s) necessary to complete the mixture on the surface of said plate. The polymerization is completed on the plate under resin polymerization conditions whereby a lithographic plate containing a printable resinous image is produced.

A suitable predetermined image-reproducing method for depositing the reactants onto the plate comprises introducing into a computer central processing unit digital information corresponding to the pattern of an image. The digital information is used to operate the printer head in connection with the computer and with means to convert the digital information to mechanical, image-descriptive movements of the printer head.

DETAILED DESCRIPTION OF THE INVENTION

Figure 1:
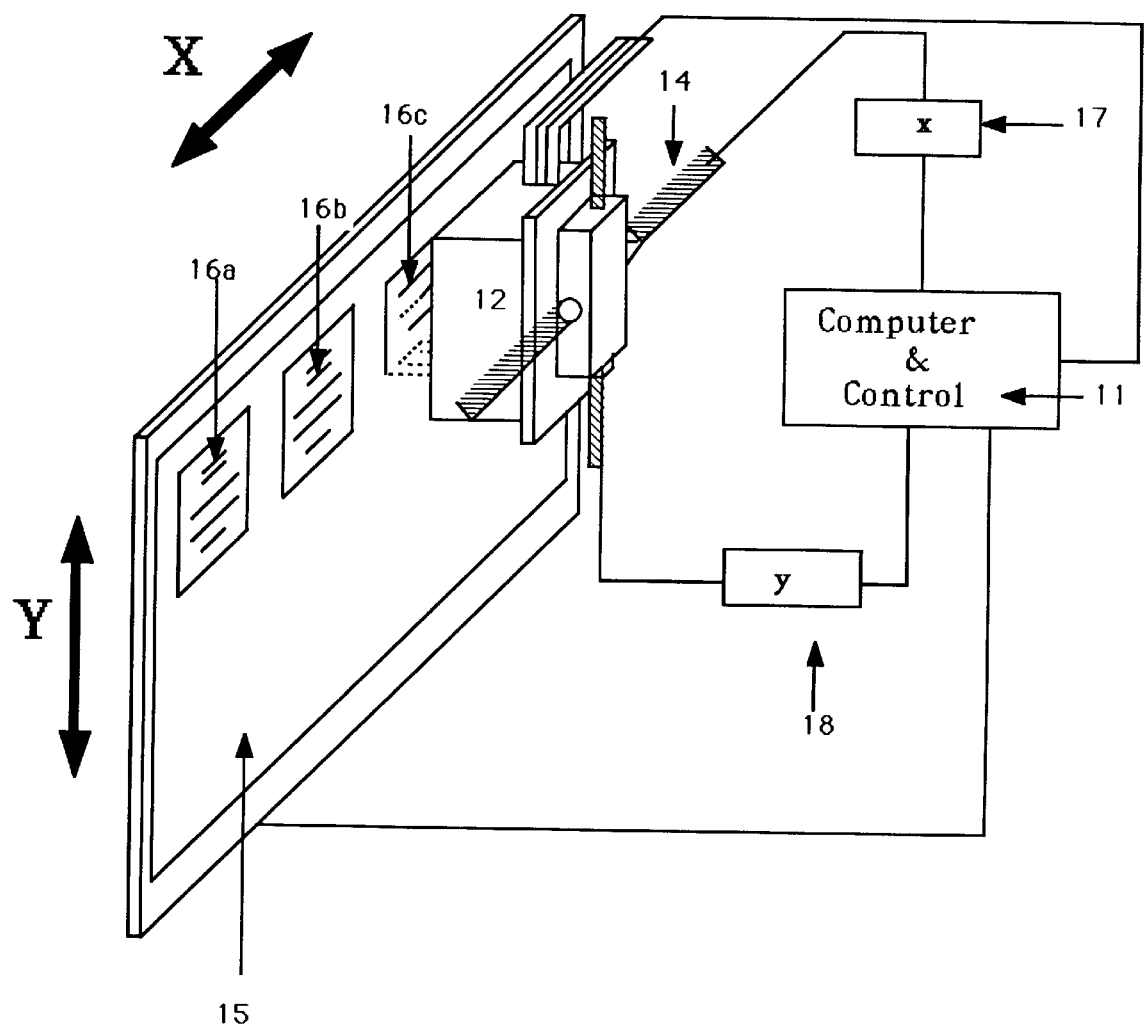
FIG. 1 represents a schematic diagram of a control system employed in the present invention.

The invention comprises a process for producing a printable lithographic printing plate by creating a hardened, solid resin image on the plate. The image is created from resin forming reactants, at least one of which is a liquid or dissolved in a solvent as deposited on the plate by an ink jet type printing head to precisely describe the image to be printed. The term reactants as used herein refers to polymerizable resin forming monomers and polymerization catalysts, initiators or intermediates, including any portion of the electromagnetic spectrum, air/oxygen, and the like. Monomers include one or more generally low molecular weight polymer, copolymer or terpolymer-forming chemical (s) or prepolymers such as oligomers capable of further polymerization into higher molecular weight solid resins. All the resin forming reactants are combined on the surface of a treated or untreated lithographic plate to form a complete resin-forming reaction mixture under conditions sufficient to convert the mixture to a resin. The resin so formed may comprise a cross-linked or linear polymer.

By way of explanation and without intending to limit the scope of the invention, the resin forming reaction mixture can be formed and polymerized on the surface of a treated or untreated plate by one or more of the following general methods:

I. A plate is coated with either resin forming monomer(s) or a polymerization initiator and monomers or initiator are deposited as droplets from an ink jet printer head onto the plate in a predetermined manner to describe the image pattern and complete the reaction mixture under resin-forming conditions.

II. Monomers are deposited as droplets from an ink jet printer head onto the plate in a predetermined manner to describe the image pattern and polymerization is carried out by exposing the plate to electromagnetic radiation such as UV light or an air/oxygen environment.

III. Two or more monomers or monomer(s) and initiator contained in two or more ink jet printer heads are deposited simultaneously with mixing as droplets onto the plate in a predetermined manner to describe the image pattern and complete the reaction mixture under resin-forming conditions. Optionally, where the reaction mixture comprises at least three reactants, the plate can be precoated with one reactant.

IV. A plate is coated with a soluble resin such as gum arabic containing either resin forming monomer(s) or a polymerization initiator and monomers or initiator are deposited as droplets from an ink jet printer head onto the plate in a predetermined manner to describe the image pattern and complete the reaction mixture under resin-forming conditions.

In the present invention, the image-forming layer is generally a hydrophobic layer and hydrophobic substances are deposited on such layer; such hydrophobic substances accept waterless or oleic-type inks. It is within the scope of the present invention, however, to coat the surface of a normally hydrophilic plate to render the surface hydrophobic. The present invention would then utilize hydrophilic compounds to form the image on the plate surface. Moreover, the layer may be either a positive or negative photosensitive layer.

The process of the invention utilizes ink jet fluids comprising hardenable materials that will harden and become bound to the surface of the printing plate, thus providing an image that will endure tens of thousands of printing runs.

Suitable hardenable materials include polymers that will harden upon exposure to electromagnetic radiation, particularly ultraviolet light radiation or electron beam radiation. Such radiation-hardenable polymers include urethane-acrylate, epoxy-acrylate and polyester-acrylate oligomers. Preferably, the radiation-hardenable polymer is an epoxy-acrylate oligomer.

Alternatively, the hardenable material may be an adhesive which will harden upon exposure to the air, anaerobically or by contact with the metal of the plate. Suitable examples of such adhesives include the cyanocrylates.

In another embodiment, the ink jet fluid may comprise a two-component epoxy resin\epoxy resin hardening agent system. Examples of suitable epoxy resins include Bisphenol A diglycidyl ethers of various molecular weights, cycloaliphatic epoxides with methyl tetrahydrophthalic anhydride or hexahydrophthalic anhydride, etc. (the typical flexibilizers and polyols may also be present, if desired). The preferred epoxy resin for the purposes of the present invention is the Bisphenol A diglycidyl ether type.

The epoxy resin hardening agent may be an aliphatic, cycloapliphatic or aromatic amine such as diethylene triamine, triethylene tetramine, tetraethylene pentamine, methylene dianiline, metaphenylene diamine, polamides, and the like. The preferred epoxy resin hardening agent is a polyamide.

Suitable monomers for the instant invention comprise bifunctional or polyfunctional monomers or prepolymers selected from the group consisting of epoxides, polyamines, alkyl and aryl isocyanates, polyols, acyl halides, formaldehyde, phenol, bis-phenol A, maleic anhydride, phthalic anhydride, acrylic acid, cyanoacrylate, methacrylic acid, styrene, vinyl toluene, alpha methyl styrene, vinyl chloride, vinylidene chloride, acrylonitrile, acrylamide, methyl and ethyl vinyl ether, vinyl acetate, vinyl alcohol/acetate, and esters and polyesters of acrylic acid and methacrylic acid.

For that embodiment in which the hardenable material comprises a radiation-hardenable polymer, the radiation source to be used for hardening the polymer and bonding it to the printing plate surface will typically be a mercury vapor lamp where hardening by ultraviolet radiation is desired. Such mercury vapor lamp will usually be of the medium pressure type (i.e. ~$10^2$ Torr); such lamps have lifetimes in excess of 5,000 hours and have efficient spectral output with two dominant UV bands at 365 and 366 nm.

In the case of electron beam-hardenable polymers, the radiation source will typically be an electron beam generator of the scanned beam type or linear cathode type. Regardless of which radiation source is chosen, it is desirable to choose the polymer type, radiation source, radiation dosage, exposure time, etc. such that the polymer will harden and bond to the printing plate surface in as short a time as is practicable.

The process of the present invention involves the formation of an image derived from digitized computer information on the surface of a printing plate. The image is deposited on the plate in the form of ink jet droplets which in turn are deposited from an ink jet printing head. The printing head, movable along "x" (horizontal) and "y" (vertical) axes, is mounted upon an assembly (table) which is also movable in the x-y plane. Drive mechanisms, e.g. step motors, controlled by a computer, move the jet of the printing head along the "x" and "y" axes to position the ink jet droplets upon the plate surface. The table supporting the printing head is also movable in the x-y plane by means of drive mechanisms. The movement of the table provides for the printing of multiple pages upon large lithographic plates. The fluid medium dispensed by the ink jet printing head is caused to harden and bond to the printing plate surface upon contact therewith, or immediately thereafter.

The present invention may be better understood by reference to the accompanying drawings. For the purposes of brevity and clarity, like components and elements bear the same designation throughout the figure.

FIG. 1 depicts an ink jet printing head assembly for use with the apparatus of the present invention. The assembly is capable of producing lithographic plates of commercial quality since it is fast and accurate when depositing ink jet droplets.

It has been found that the Raster Image Processing (RIP) for lithographic ink jet processes, must be performed with large amounts of information in order to provide the high resolution required for commercially viable offset printing plates. Computer processor and control unit 11 utilized for converting the large amounts of information into print head signals, includes a computer with large memory capacity and high speed calculation capability. Commercial plates require scanning a large plate surface and means for producing multiple pages as shown. Ink jet printing head 12 is often required to make subsequent scans in synchronization. This necessitates a very high degree of mechanical accuracy.

In order to provide high speed imaging, printing head 12 is mounted on any x-y table 14 such as Opti-copy Imposer x-y table or IPM Platemaker x-y table. In order to scan the surface of plate 15, computer and control unit 11 provides digitally times "x" (horizontal), "y" (vertical ink jetting movement to print head 12 and planar x-y movement (shown by the "x" and "y" arrows in FIG. 1) to table 14. The x-y movement of table 14 is accomplished by drive mechanisms (not shown) and the "x" and "y" ink jetting movement of printing head 12 are provided by drive mechanisms (e.g. step motors) 17 and 18, respectively. After first page 16a is imaged, printing head 12 is subsequently moved to other positions on the surface of plate 15 in order to image subsequent pages 16b, 16c, etc. The imaging of the pages is not necessarily carried out in sequence. In fact, the pages are usually out of sequence, and may even be printed upside down with respect to adjacent pages.

Ink jet printing head 12 has a nozzle plate with a plurality of nozzles (not shown). A reservoir disposed inside printing head 12 supplies the ink to the nozzles through a series of channels.

The processor (CPU) of computer and control unit 11 supplies graphics and textual information to printing head 12. The higher the resolution, i.e. the greater the dots per inch, the more digital information is required to be stored and disseminated by the computer memory.

Figure 2A:
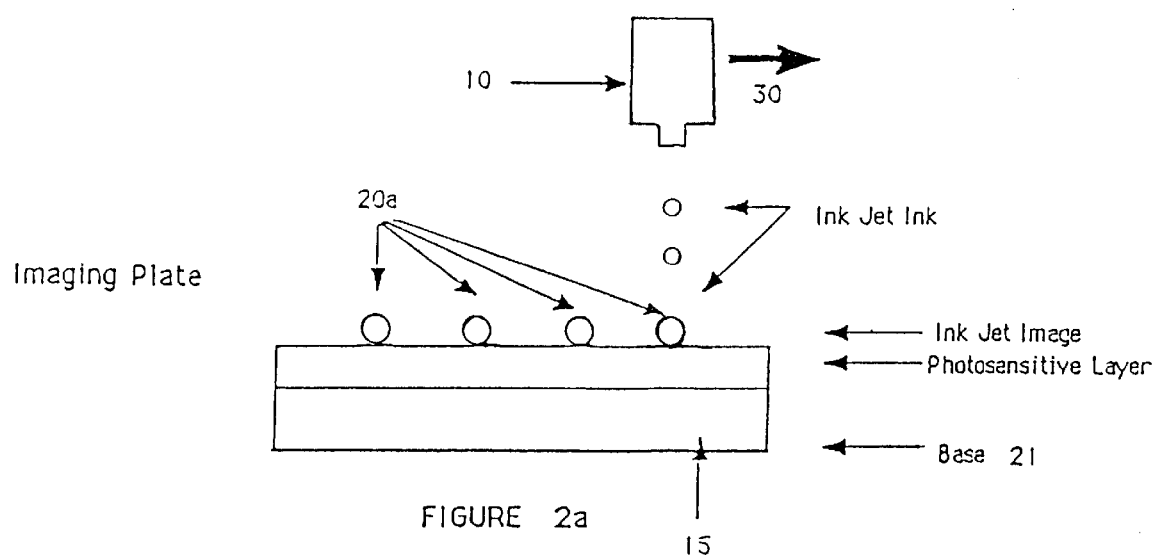
FIGS. 2a and 2b depict schematic flow diagrams of an embodiment of this invention.
Figure 2B:
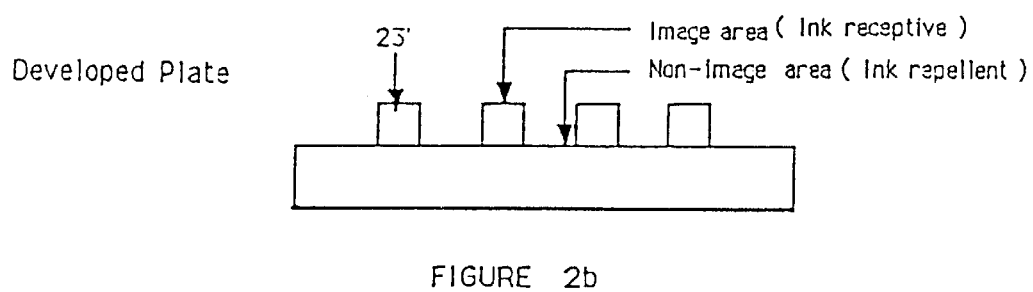

The sequential schematic flow diagrams of a first process embodiment of the invention are shown in FIGS. 2a and 2b. Printing head assembly 10 moves (in the direction of arrow 30) past plate 15. Assembly 10 jets droplets 20a of an opaque fluid that deposit upon plate 15 to form the image mask. The plate is then decoated in a conventional plate processor. Image pattern 20a prevents the decoater chemical from reacting with the photosensitive layer underlying the image layer. Thus, the non-image area is decoated and becomes ink repellant.

The first process embodiment is described in more detail with reference to Examples 1–4 set forth below.

EXAMPLE 1

A printing plate comprised of a grained aluminum substrate overcoated with an organic photosensitive coating was employed in this Example. A solid or liquid ink jet ink was jetted on the surface of the plate to form the imaging pattern. The plate was then decoated with a plate processor such that the image pattern prevented the decoating chemical from reacting with the photosensitive layer underlying the image pattern and the non-image pattern area was decoated. When a conventional printing ink was applied on the plate surface, the image area accepted the ink.

EXAMPLE 2

In another embodiment of the invention, the printing plate was coated with a clear film-forming acrylic binder which was alkali or alcohol soluble (other binders are also useful for the purposes of this invention, e.g. polyesters, polycarbonates, polystyrene, phenolics, polyurethanes, etc. The ink jet printing head was filled with an ultraviolet light-curable printing ink which was then jetted onto the surface of the coated substrate to form an image pattern. The resultant plate was then exposed to ultraviolet light to harden the image pattern and was then developed in a conventional manner.

EXAMPLE 3

The coated plate of Example 2 is employed in this embodiment. The ink jet printing head is filled with a thermally-curable ink which is then jetted onto the surface of the plate. The plate is then heated to harden the image pattern and developed in a conventional manner.

EXAMPLE 4

The coated plate of Example 2 was employed in this embodiment. An ink jet printing head with two nozzles connected to separate ink reservoirs was used in this Example. The reservoirs were filled with an epoxy resin and an epoxy resin amine hardener. The printing head jetted a drop of each component at the same place on the plate surface where they mixed and reacted to form a single, hardened dot to form an image pattern. The resultant plate was then developed in a conventional manner.

Figure 3A:
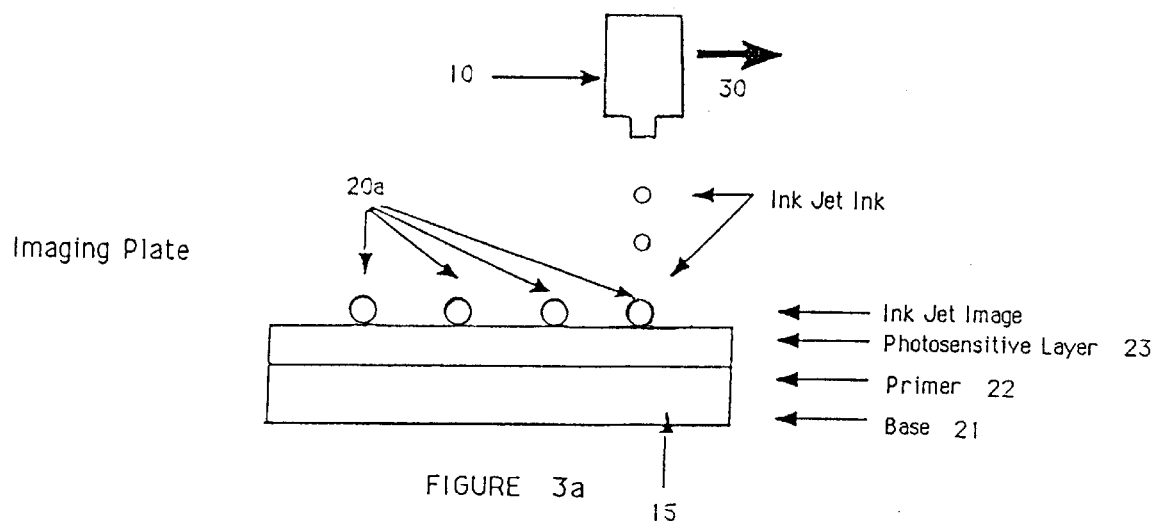
FIGS. 3a, 3b and 3c depict schematic flow diagrams of another embodiment of this invention.
Figure 3B:
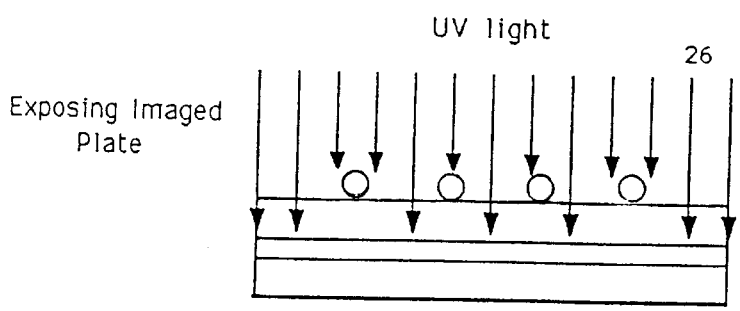
Figure 3C:
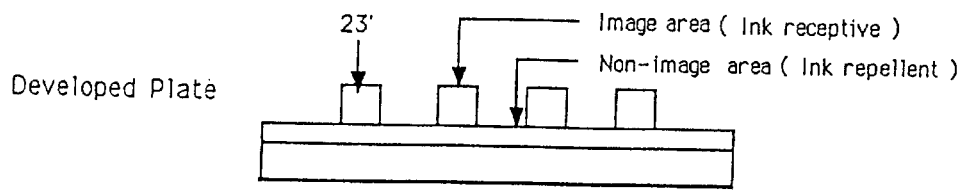

The second embodiment of this invention is described in more detail with reference to Examples 5–8 set forth below and is depicted in FIGS. 3a, 3b, and 3c which are sequential schematic flow diagrams. The printing head assembly moves (in the direction of arrow 30) past plate 15. The assembly jets droplets 20b of an opaque fluid that deposit and form an image upon plate 15. The opaque fluid may be a printing ink or any opaque substance that will provide an image upon the plate surface.

After the image has been deposited upon the plate surface, the plate is irradiated with ultraviolet light (arrows 26), as shown in FIG. 3b. Those areas covered by opaque droplets 20b will mask the photosensitive 23 and the area radiated by the ultraviolet light will become developable. After development, image areas 23' will remain, as shown in FIG. 3c. Image areas 23' are ink receptive while the non-image areas are ink repellant, thus providing an offset plate.

EXAMPLE 5

In this embodiment, a positive plate was used. The plate comprised an aluminum base overcoated with primer and photosensitive layers, as taught in U.S. Pat. No. 3,635,709. A solid ink jet ink was jetted upon the surface of a plate to form an image pattern. The plate was then exposed to ultraviolet light. During exposure, the image area blocked the ultraviolet light, thus leaving only the exposed photosensitive area to be photoreacted. The resultant plate was then developed in a conventional manner. When a conventional printing ink was rubbed on the plate surface, the unexposed image area accepted the ink. The offset plate fabricated by this method was found to be suitable for long printing runs.

EXAMPLE 6

The printing plate of Example 5 was employed in this embodiment. The printing plate surface was covered with a thin layer of gum arabic to render the surface hydrophilic. A water-based ink jet ink was jetted upon the surface of the plate to form an image pattern, and the plate was thereafter exposed to ultraviolet light. During exposure, the image area blocked the ultraviolet light, thus leaving only the exposed photosensitive area to be photoreacted. The resultant plate was then developed in a conventional manner. The ink jet ink and photosensitive layers were washed away by the developer, leaving only unexposed photosensitive areas remaining on the plate. When an offset printing ink was rubbed on the plate, the remaining image area accepted the ink. The offset printing plate fabricated by this method was also suitable for long printing runs.

EXAMPLE 7

In another embodiment of the invention, a negative plate as described in U.S. Pat. No. 4,171,974 was used. This plate comprised an aluminum base overcoated with a photosensitive layer. The printing plate surface was covered with a thin layer of gum arabic to render the surface hydrophilic. A water-based ink was jetted upon the surface of the plate to form an image pattern; the ink acted as a mask to block ultraviolet light during exposure. Upon development, the unexposed photosensitive layer was removed by a developer such as that described in U.S. Pat. No. 3,891,439, leaving the exposed area on the plate.

EXAMPLE 8

In this embodiment, a Toray Waterless positive plate was used. The plate consisted of four layers overcoated on an aluminum base: a transparent protecting film layer, silicone layer, photosensitive layer and a primer layer. The solid ink jet ink was jetted upon the surface of the plate to form an image pattern and the plate was then exposed to ultraviolet light. After exposure, the protective top film layer was manually removed, and the resultant plate was then developed, washed and dried in a conventional manner. The photosensitive layer in the image areas where the silicone layer was removed became ink receptive.

The following prophetic examples of the invention are presented to further illustrate the direct preparation of lithographic printing plates by in situ polymerization of resin forming monomers. The image is described on the plate using image information digitally acquired through a computer central processing unit which is also operatively connected to the ink jet printer heads to drive those heads in conformance with the digital image information.

Examples 9A–9B describe the printing platemaking process using an ink jet which contains reactants that directly react with the substrate. The substrate is aluminum having a grained aluminum surface or aluminum anodized with sulfuric acid or phosphoric acid. The anodized aluminum may contain an interlayer such as a silicated interlayer. The ink jet contacts the surface of the substrate and reacts with the substrate to form a hardened resinous image pattern.

EXAMPLE 9A

The ink jet printing head is filled with an ink such as Thread Locker available from Locktite, Inc. The ink is ejected from the printing head onto the surface of the grained substrate to form the image. The metal substrate acts as polymerization initiator to cause the formation of a hardened resin image.

EXAMPLE 9B

The substrate is a pumice grained base with a silicated interlayer and the ink jet printing heads contains acidinhibited cyanoacrylate. When the head ejects the ink onto the substrate the acid inhibitors are neutralized by the interlayer and the cyanoacrylate polymerizes to form a harden resinous image.

The following Examples 10A–10B describe the invention employing two ink jet droplets reacting to form a single hardened dot on the surface of the substrate. The ink jet printing head has two nozzles which connect to separate ink reservoirs. The two ink droplets are ejected onto the same spot on the surface of the substrate where they are mixed and reacted to form a single hardened dot.

EXAMPLE 10A

An ink jet printing head connected to separate ink reservoirs is used. The reservoirs are filled with an epoxy resin and an epoxy resin amine hardener. The printing head ejects a droplet of each component at the same place on the surface of the substrate where they mix, react and heated to form a single, hardened dot.

Examples of suitable epoxy resins include bisphenol A diglycidyl ethers of various molecular weights, cycloaliphatic epoxides with methyl tetrahydrophthalic anhydride or hexahydrophthalic anhydride. The hardening agent may be aliphatic, cycloaliphatic or aromatic amine such as diethylene triamine, triethylene tetramine, and the like.

EXAMPLE 10B

An ink jet printing head connected to separate ink reservoirs is used. The reservoirs are filled with acrylate resin (e.g. trimethylolpropanetriacrylate-TMPTA) and amine hardener (e.g. Jeff amine from Texaco Co.) The printing head ejects a droplet of each component at the same place on the surface of the substrate where they mix, react and heated to form a single, hardened dot.

The following Examples 11A–11F describe a plate making process by using ink jet ink reacting with a coated protective layer on the surface of a substrate to form a hardened image pattern. The substrate can be either a smooth aluminum base or anodized aluminum base with interlayers (e.g. silicated or PVPA interlayer). The substrate is then coated with different chemical compounds, such as gum arabic, amine hardener, to form a protective layer. When the ink jet ink is in contact with the protective layer, the ink reacts chemically with the protective layer to form an image pattern. The imaged substrate is then developed in a conventional manner to remove non-imaged protective layers.

EXAMPLE 11A

An electro-grained substrate is coated with a thin layer of gum arabic and reducing agents to form a protective layer and a potassium dichromate ink is used in the printing head. When the ink is ejected onto the coated substrate, the ink reacts with the hardened protective layer to form a hardened image pattern. The imaged substrate is then developed in a conventional manner to remove the non-imaged protective layer.

EXAMPLE 11B

The ink in the ink jet printing head comprises TMPTA hexanediol diacrylate. The chemical grained substrate is coated with an amine layer, e.g. Jeff amine® from Texaco Co. or Versa® mid from General Mills Co. When the ink is ejected onto the coated substrate, the ink droplets are reacted with the amine layer on the substrate to form images. The imaged substrate is then heated to harden the images on the surface of the substrate. The imaged substrate is then developed in a conventional manner to remove non-imaged protective layer.

EXAMPLE 11C

A pumice grained aluminum substrate is coated with a thin inorganic interlayer of gum arabic plus acid. The ink jet printing head contains an epoxy such as vinylcyclohexane diepoxide ink. When the ink is ejected onto the coated substrate, the ink reacts with the thin layer of the substrate to form an image pattern. The imaged substrate is then heated to harden the image pattern on the surface of the substrate. The imaged substrate is then developed in a conventional manner to remove the non-imaged protective layer.

EXAMPLE 11D

The coated substrate in Example C is also used in this example. But the ink jet printing head is filled with ink containing a zinc complexing agent compound. The ink jet printing head jets the ink droplets onto the surface of coated substrate. The ink droplets react with the protective layer to form a hard image pattern. The imaged substrate is then developed in a conventional manner to remove the non-imaged protective layer.

EXAMPLE 11E

The ink jet printing head contains epoxy resin ink. A brush grained substrate with a layer combined of gum arabic and amine hardener is used. The ink droplet jetted from the printing head reacts with the coated layer on the surface of substrate to form an image pattern. The imaged substrate is then heated to harden the image pattern. The imaged substrate is developed in a conventional manner to remove the non-imaged coated layer.

EXAMPLE 11F

The ink jet printing head is filled with ink which contains a vinyl ether compound. The electro-grained substrate with an organic polymer interlayer is coated with the mixture of gum and organic acid to form a protective layer on the top of substrate surface. The ink ejected from the head reacts with protective layer to form an image pattern on the surface of the coated substrate. The imaged substrate is then developed in a conventional manner to remove the non-imaged protective layer.

The following Examples 12–16 present the methods and results of actual experiments illustrating the use of various resin-based systems as the image forming material employed in ink jet printing heads to provide digitized images on lithographic plates that are capable of printing large numbers of image copies.

EXAMPLE 12

In this embodiment, poly(hydroxy styrene) polymer (supplied by Hoechst Celanese Corp.) was dissolved in a mixture of low viscosity cycloaliphatic epoxide, (e.g., cyracure 6105 from Union Carbide) and vinyl ether (e.g., divinyl ether from ISP Chemical Corp.). Three to five weight percent of photoreactive onium salts (e.g., cyracure 6974 and/or 6990 sulfonium salts from Union Carbide and/or 9310C iodonium salt from GE Corporation) were added to the liquid mixture. The viscosity of this polymer solution was 75 cps at 25° C. The polymer solution was taken in an ink jet printer head whose temperature was between 100° and 130° C. The hot solution was jetted on an anodized aluminum (Al) printing plate and the image was cured by passing the plate under two 200 watts/inch medium pressure Hg lamps at a speed of 200 ft/min. A solid, hard, abrasion resistant image was obtained with good adhesion on the Al plate.

EXAMPLE 13

The plate of Example 12 was used as an offset lithographic plate on a printing press. When compared to a standard wax based image on a printing plate obtained in a similar fashion, the cationic ink based image offered substantially improved performance, e.g., 25,000 versus 75,000 impressions, respectively.

EXAMPLE 14

The formulation described above as Example 12 was jetted onto an anodized Al plate and was passed through an electron beam source at 3 MR energy. A hard abrasion resistant and fountain solution resistant cured image was obtained.

EXAMPLE 15

A novolac resin ( VPN 1110 supplied by Hoechst Celanese Corp.) was dissolved in a mixture of cycloaliphatic epoxide and vinyl ether as described in Example 12. 3–5 weight percent of cationic onium salt photoinitiators were added. The viscosity of the final resin solution was 75 cps at 25° C. The solution was taken in an ink jet printer head at 130 degree C. The viscosity of the solution at the printer head temperature was measured to be 10 cps. The jetted image was cured the same way as described in the previous example 12 and a hard abrasion resistant image with excellent adhesion and resistance to fountain solution was obtained by Scotch tape adhesion testing using 3M 610 Tape. Rosos KS 500 was rubbed onto the image with a cotton swab up to 500 double rubs.

EXAMPLE 16

In order to develop a low viscosity ink system for printing at room temperature, a mixture of maleate and vinyl ether (e.g., DSM 102 and DSM 109 from DSM Desotech Corp., IL) along with 2% of an oligomeric photoinitiator (e.g., KIP 10OF from Sartomer). The viscosity of the solution was 18 cps at 25° C. The solution was jetted from an ink jet head at room temperature on an anodized Al plate. Upon curing the image under UV illumination a hard, abrasion resistant image was obtained with good resistance towards fountain solution, as in Example 15.

EXAMPLE 17

A multifunctional novolac epoxy resin (e.g., Epirez SU-8 from Shell Chemical) and a novolac resin ( VPN 1110 from Hoechst Celanese) were dissolved in a low viscosity epoxy diluent (e.g., Cyracure 6105) was mixed with a solution of a flexible novolac resin (e.g., NC 513 or NC 547 from Cardolite Corporation) dissolved in limonene dioxide (from elf Atochem). 3–5 weight percent of photoreactive onium salts were added to this resin solution. This solution was taken in an ink jet printer head at 130° C. and was jetted onto an anodized Al plate. When cured with a UV light (300 W/in at 100 ft./min) a hard abrasion resistant image with good adhesion and resistance to fountain solution was obtained.

What is claimed is:

1. A method for producing a printing plate containing a printable resinous image comprising:

depositing at least two resin-producing comonomers in a pre-determined image-reproducing manner on a plate substrate using at least two printing heads to form a mixture, wherein each comonomer is contained and deposited by a separate print head; and polymerizing said mixture under resin polymerization conditions to form a printing plate.

2. The method of claim 1 wherein said comonomers are selected from the group consisting of epoxides, amines, acrylates, methacrylates, cyanoacrylates, carboxylic acids, carboxylic acid anhydrides, vinyl ethers, phenols, alcohols and vinyl benzene derivatives.

3. The method of claim 1 wherein one printer head also contains copolymerization initiator or catalyst.

* * * * *